United States Patent
Weng

(10) Patent No.: US 6,640,319 B1
(45) Date of Patent: Oct. 28, 2003

(54) MIS-SYNCHRONIZATION DETECTION SYSTEM

(75) Inventor: Lih-Jyh Weng, Shrewsbury, MA (US)

(73) Assignee: Maxtor Corporation, Longmont, CO (US)

( * ) Notice: Subject to any disclaimer, the term of this patent is extended or adjusted under 35 U.S.C. 154(b) by 478 days.

(21) Appl. No.: 09/650,968

(22) Filed: Aug. 29, 2000

(51) Int. Cl.$^7$ .................. H03M 13/15; H03M 13/33
(52) U.S. Cl. ................................ 714/707; 714/784
(58) Field of Search ................................ 714/707, 784

(56) References Cited

U.S. PATENT DOCUMENTS

| | | | | |
|---|---|---|---|---|
| 4,847,705 A | * | 7/1989 | Weng et al. | 360/49 |
| 5,528,607 A | * | 6/1996 | Weng et al. | 714/775 |
| 6,463,564 B1 | * | 10/2002 | Weng | 714/784 |

* cited by examiner

Primary Examiner—R. Stephen Dildine
(74) Attorney, Agent, or Firm—Cesari and McKenna, LLP

(57) ABSTRACT

An R-stage error correction system constructed in accordance with a distance d Reed-Soloman code performs a modified encoding step to include in the encoding a predetermined non-zero "coset symbol" that results in the encoder producing a code word for recording that includes a coset leader of a distance d-1 code. During the modified encoding step, the coset symbol is included in the value produced by the $R^{th}$ stage of the encoder during the encoding of a code word data symbol or a first redundancy symbol. The coset symbol is thereafter included in the encoding of the remaining redundancy symbols when the value produced by the last stage is fed back to the preceding stages. During decoding, the system decodes the code word and the included coset leader to generate associated error syndromes. In a last decoding step, the system removes the effects of the included coset leader from the syndromes, by combining a predetermined syndrome value with the syndrome value generated in the $R^{th}$ stage. If there is no synchronization error and the code word is error-free, the result is a set of all zero syndromes. If there are code word errors but no synchronization error, the system produces a non-zero syndrome pattern that is associated with a correctable number of errors. Otherwise, if there is a synchronization error, the inclusion of the predetermined syndrome value produces a syndrome pattern that is associated with an uncorrectable number of errors.

10 Claims, 2 Drawing Sheets

MIS-SYNCHRONIZATION DETECTION SYSTEM

FIELD OF THE INVENTION

The invention is related to systems for detecting synchronization errors.

BACKGROUND OF THE INVENTION

Data are recorded on magnetic disks in tracks that are separated into sectors. Many sectors include, respectively, a header portion that lists the sector number and other information, and a data portion in which the data are recorded. Other sectors include the data portions, but not the headers. Synchronization information is included between the sectors, so that a disk drive can determine the start of the individual sectors and ultimately the start of the data portions of the respective sectors. The drive then, as necessary, counts sectors after reading a header to arrive at the designated sector to be written to or read.

Before recording, the data are typically encoded into data code words using an is error correction code (ECC). The data code word is then recorded in the data portion of the sector. To later read the data, a disk drive moves a read/write head over the appropriate track and, using the recorded synchronization information, determines the start of the data portion of the sector of interest. The head then reads the data code word and supplies it to a decoder. The decoder reproduces the data by manipulating the code word symbols and, as necessary, correcting any errors using the ECC.

If the drive makes a mistake in determining the location of the start of the data code word, that is, if there is a synchronization error, the drive reads a portion of the data code word and either information that precedes the data code word or information that follows the data code word, depending on the direction of the synchronization error. If the decoder mistakenly interprets what is read from the disk as a valid data code word, the decoder then "corrects" what it perceives as errors in the code word, and sends the result as error-free data to an application or a user.

The ECCs that are most often used are Reed-Solomon codes. The Reed-Solomon codes encode the data over a Galois Field ($2^q$) where "q" is the number of bits in a code symbol or element. The Reed-Solomon codes are cyclic. Accordingly, if $c_0 c_1 \ldots c_c$ is an unshortened code word, where the $c_j$ are elements of $GF(2^p)$, $c_1 \ldots c_c c_0$ is also a code word, as is $c_c c_0 c_1 \ldots c_{c-1}$. This means that a synchronization error of one or more symbols may produce a different, but valid code word. If the mis-synchronization involves a number of bits rather than full symbols, the decoder most likely detects that every code word symbol is in error, assuming the code word includes a relatively large number of redundancy symbols. The decoder thus cannot correct the errors, and labels the data as erroneous.

To protect against the misinterpretation of the symbol-sized synchronization errors, a certain prior system adds a noise-like sequence into each data code word before the code word is recorded. Using Galois Field operations, the addition is accomplished by XOR'ing the sequence and the data code word. Before decoding, the system removes the sequence from the retrieved code word by XOR'ing the sequence to the code word. If the read operation is synchronized to the start of the codeword, that is, if there is no synchronization error, the XOR'ing of the sequence and the retrieved code word reproduces the original data code word. Otherwise, the XOR'ing of the sequence to the retrieved code word introduces errors into the code word. Assuming the sequence is properly chosen such that the XOR'ing of the sequence with a shifted, or misaligned, version of the sequence does not result in a valid codeword, the decoder detects more errors in the decoded code word than the ECC can correct. The decoder then labels the mis-synchronized data as erroneous. If the sequence is not properly chosen and the XOR'ing operation instead produces a different and valid code word, the decoder "corrects" the errors using the ECC.

The prior system uses a trial and error approach to finding the noise-like sequence. The trial and error approach is time consuming and does not necessarily produce a sequence that introduces a maximum number of errors into a retrieved code word which contains synchronization errors. Further, the prior systems have to store the selected sequence in the encoder and also in the decoder, which increases the overall storage requirements of the system. Accordingly, the mis-synchronization technique may be impractical for systems that have limited storage capacities.

An error correction system that solves certain of these problems produces a code word for recording by XOR'ing to a data code word, which is encoded in accordance with a distance d Reed-Solomon code, a coset leader that is a code word of a distance d' super code, but not a code word of the distance d code. When the code word is retrieved, the system XOR's it with the coset leader. If there is no synchronization error, the second XOR'ing operation removes the coset leader from the code word, to reproduce the data code word. If there is a synchronization error, the XOR'ing operation ensures that the retrieved code word includes a term that is a Hamming distance of d' from every valid code word of the distance d Reed-Solomon code. The system then decodes the result in a conventional manner, and as long as d'>d/2 the system detects more errors than the ECC can correct.

The prior system determines appropriate distance d' super codes from which to select the coset leader based on the generator polynomial of the distance d Reed-Solomon code. The system then selects from one of these codes a coset leader b(x) that is not also a code word of the distance d code. Next, the system tests that the term $j(x)=b(x)*x^s+b(x)$ is not a valid code word of the distance d code for every S of interest, where $-T \leq S < T$ and T is the maximum number of symbols by which the read/write head may be misaligned. If j(x) is a valid code word of the distance d code, the system selects and tests each of the remaining coset leaders from the distance d' codes. If none of the coset leaders are appropriate, the system selects and tests the coset leaders from distance d"=d'-1 Reed-Solomon codes, and an appropriate coset leader in the distance d" code can generally be found.

To reduce the associated storage requirements, the system may select a coset leader to be a code word that contains several versions of a shortened code word of the distance d' code. The system then stores only the shortened code word, and essentially reproduces the coset leader by XORing the shortened code word to the data code word a number of times. Alternatively, the system may generate the coset leader from the stored shortened code word using, for example, a dedicated shift register.

The prior system thus provides a mechanism to select a coset leader for use in mis-synchronization detection and a way to reduce associated storage requirements. As discussed below, I have developed a system that provides a mechanism for including in a code word for recording a coset leader that has optimum mis-synchronization detection properties for the associated code. Further, the system minimizes storage requirements, while at the same time eliminating the need for dedicated hardware to reproduce the coset leader.

SUMMARY

The inventive system is an error correction system constructed in accordance with a distance d Reed-Soloman code that, during a modified step in the encoding operation, includes in a code word for recording a coset leader of a distance d−1 code. The modified encoding step includes in an appropriate manner in the encoding operation a predetermined non-zero "coset symbol" that results in the encoder producing a modified set of R redundancy symbols. The result of the encoding is a code word that includes in the redundancy symbols a coset leader that is a hamming distance d−1 from every valid code word of the distance d code. As discussed in more detail below, the modified encoding step ensures that the included coset leader is a code word of a distance d−1 code, and thus, optimum for detecting synchronization errors in the code words. Further, the modified encoding step eliminates the need to XOR a coset leader to a data code word in a separate step after the encoding operation has produced the data code word.

During decoding, the system decodes the recorded code word and generates associated error syndromes. In a last decoding step, the system removes the effects of the included coset leader from the syndromes, by including a predetermined syndrome value associated with the coset leader. If there is no synchronization error and the code word is error-free, the result is a set of all zero syndromes. If there are d/2 or fewer code word errors but no synchronization error, the system produces a non-zero syndrome pattern that is associated with a correctable number of errors. However, if there is a synchronization error, the inclusion of the predetermined syndrome value produces a syndrome pattern that is associated with an uncorrectable number of errors.

The error correction system stores only the coset symbol and the associated syndrome value, and thus, the storage requirements are minimal. Further, the system may be constructed by modifying a combined encoding/syndrome generating circuit, as discussed in more detail below. This is in contrast to systems that must either store the entire coset leader or include an additional encoder or dedicated shift register to generate the coset leader from, for example, a stored shortened code word.

BRIEF DESCRIPTION OF THE DRAWINGS

The invention description below refers to the accompanying drawings, of which.

DETAILED DESCRIPTION OF AN ILLUSTRATIVE EMBODIMENT

The addition and multiplication operations discussed herein are Galois Field operations.

Figure 1:
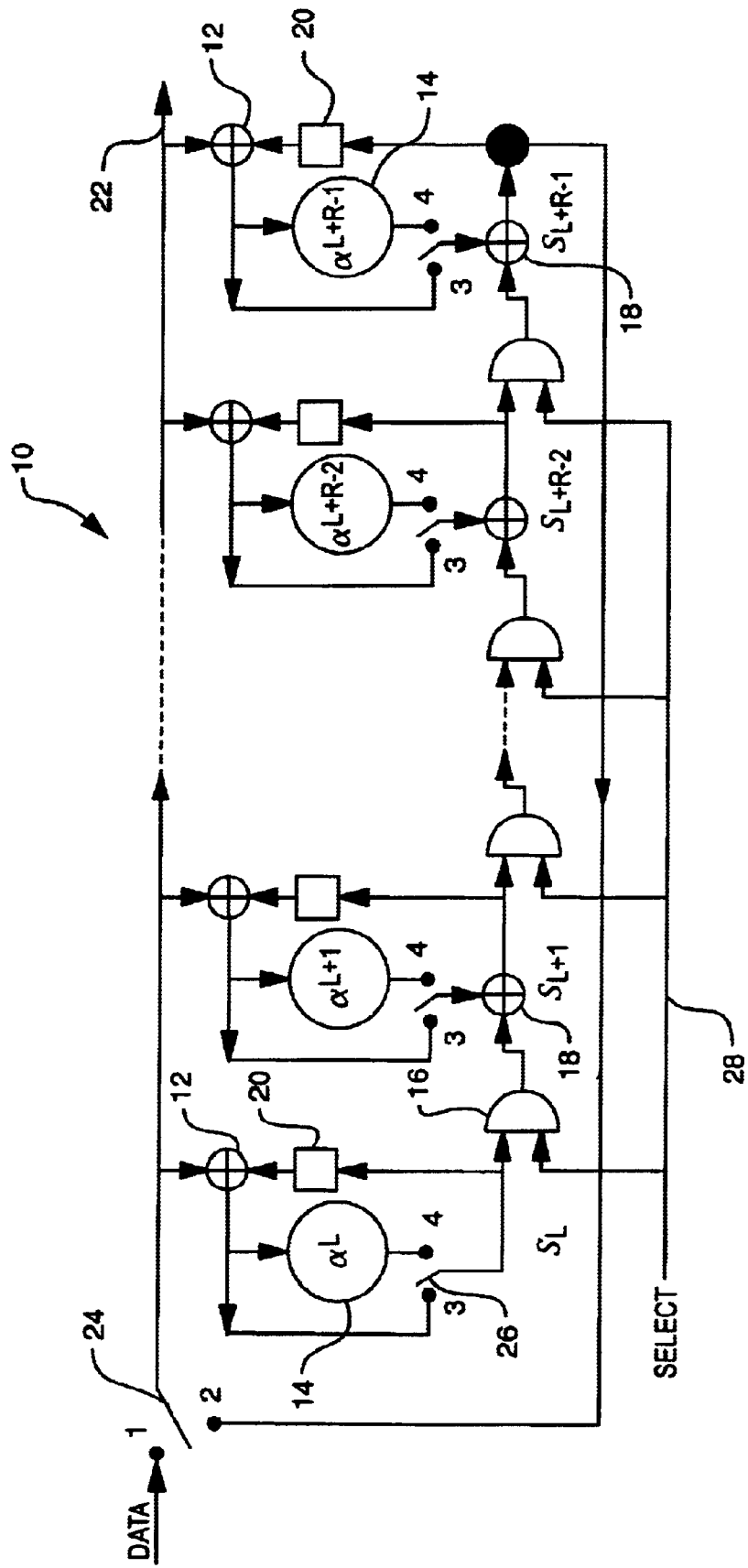
FIG. 1 is a functional block diagram of a conventional combined encoding/syndrome generation circuit.

FIG. 1 depicts a combined encoder/syndrome generation circuit 10 that is set up in accordance with the teachings of an article by Gerhard Fettweis and Martin Hassner, entitled, *A Combined Reed-Solomon Encoder And Syndrome Generator With Small Hardware Complexity*, published by IEEE in 1992, which is incorporated herein by reference. The circuit 10 uses the same Galois Field multipliers for both encoding and syndrome generation, and thus, reduces by one-half the number of multipliers from those required if separate encoder and syndrome generator circuits are used.

Before discussing the modifications to the circuit 10 that are made to as part of the inventive system, I discuss the operation of the circuit 10 in more detail.

The stages of the circuit 10 are set up in accordance with the respective factors of a Reed-Solomon code generator polynomial $g(x)=(x+\alpha^L)(x+\alpha^{L+1}) \ldots (x+\alpha^{L+R-1})$ over GF(q), where R is the number of redundancy symbols. The circuit has R stages, with each stage including an adder 12 that adds to the contents of an associated register 20 a symbol that is provided to the adder on line 22. In a first stage, the sum produced by the adder 12 is supplied to a Galois Field multiplier 14 and the product supplied to the register 20. The product is also supplied to an AND gate 16 that, during encoding operations, propagates the sum to the next stage. For the encoding operations, a select line 28 set to a signal value of 1.

In the next stage, an update adder 18 adds the product produced by the associated Galois Field multiplier 14 to the product produced by the first stage. The sum is used to update the associated register 20 and is also propagated to the next stage through the next AND gate 16. The next stage similarly adds the product produced by the associated Galois Field multiplier 14 to the propagating sum and passes the result to the associated register 20 and to next stage through the next AND gate 16, and so forth, until the propagating sum is supplied to the last stage of the circuit and included in the sum that updates the last register 20. Then, in a next clock cycle, a next symbol is supplied to the adders 12 on line 22, and the circuit 10 encodes the symbol in the same manner, and so forth.

To produce a data code word, all k data symbols are supplied to the encoder with a switch 24 in position 1. The switch 24 is then moved to position 2 for the next R clock cycles, and the next update value for the register 20 in the last stage is supplied also to line 22 as the first redundancy symbol. The first redundancy symbol is supplied to adders 12 and output from the circuit on the line 22. During a next clock cycle next redundancy symbol is produced in the last stage and supplied to line 22, and so forth. Throughout the encoding operations, switches 26 remain in position 4.

The data code word is formed from the k data symbols and the R redundancy symbols.

During syndrome generation operations, the select line 28 provides to the AND gates 16 a zero-valued signal, and the AND gates 16 essentially break the chain of update adders 18 by blocking the propagation of a sum from one adder 18 to the next. Each stage of associated registers 20, multipliers 14 and adders 12 thus operate separately to produce a corresponding error syndrome. For syndrome generation, the switch 24 is in position 1 as the code word symbols are supplied to the circuit 10. The switches 26 are in position 4 for all but the last code word symbol, at which time the switches 26 are moved to position 3. The sums produced by the adders 12 thus bypass the multipliers 14, and are supplied through the update adders 18 to the registers 20. The registers 20 then contain the associated error syndromes.

Figure 2:
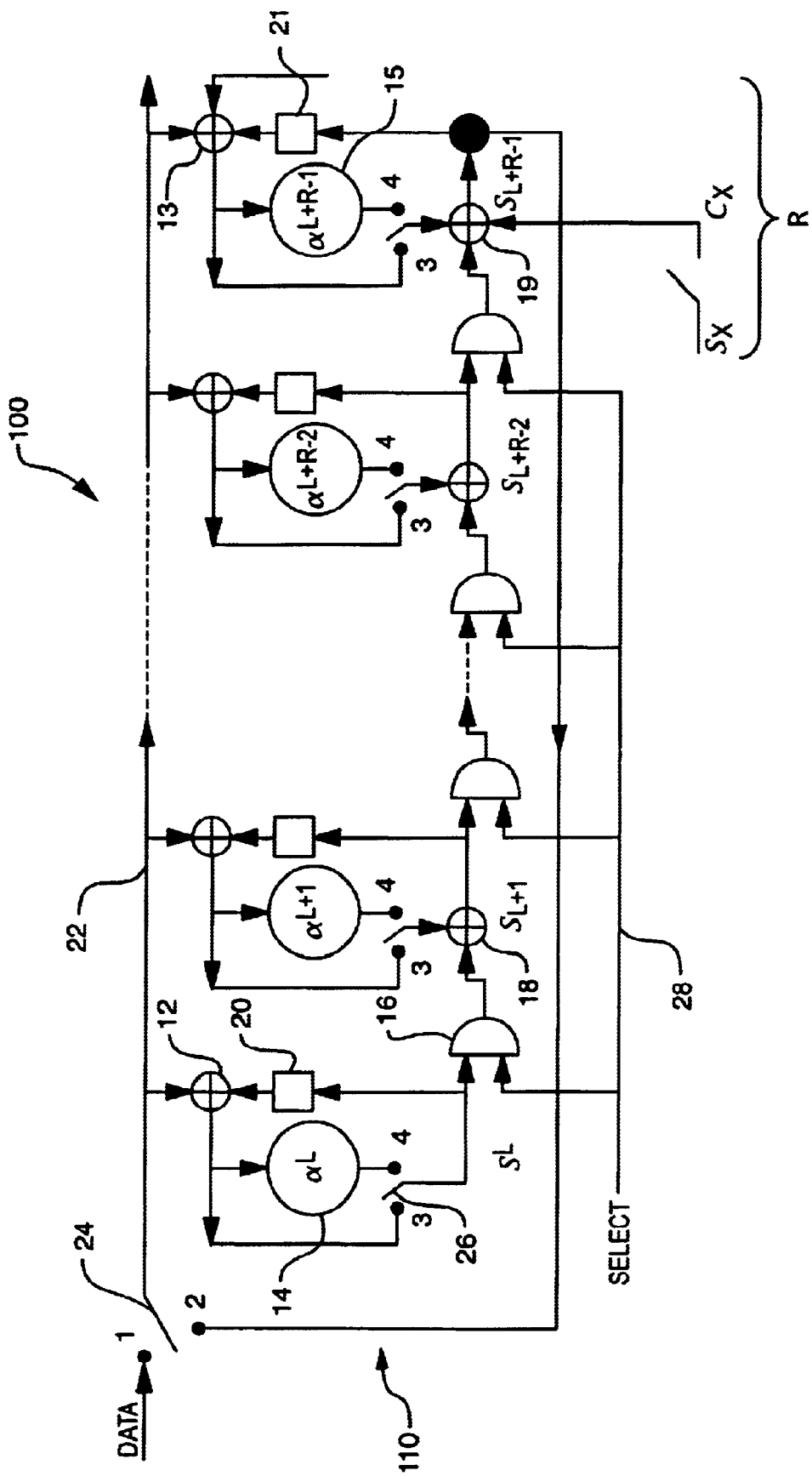
FIG. 2 is a functional block diagram of a combined encoding/syndrome generation circuit constructed in accordance with the invention.

Referring now to FIG. 2, the error correction system 100 includes a modified encoder/syndrome generator circuit 110. The modified circuit 110, which is set up in accordance with the generator polynomial g(x) of the distance d Reed-Solomon code, produces a code word for recording that includes a coset leader of a distance d−1 code that is optimum for detecting mis-synchronization in the data code words. As discussed below, when a synchronization error occurs, the decoding of the retrieved code word produces a set of error syndromes that corresponds to an uncorrectable number of code word errors.

A selected code word of a distance d−1 super code that is not a code word of the distance d code is an optimum coset leader for detecting a synchronization error in a data code word of a distance d code. The inclusion of the coset leader in the distance d data code word produces a code word for recording that is at least a hamming distance of d−1 from every other valid code word of the distance d code. The coset leader is selected such that a combination of the coset leader and a shifted version of the coset leader does not form a code word of the distance d code for all possible numbers of shifted symbols. Thus, combinations of the coset leader and versions that are shifted 1,2 . . . , S symbols, where S is the maximum number of symbols by which the read head may be shifted, do not form code words of the distance d code. This ensures that the decoding of a code word that is retrieved when the read head is mis-aligned with the start of the sector results in the detection of an uncorrectable number of errors, that is, more errors than the d/2 errors that the ECC can correct by hard decoding.

The selection of the coset leader results in certain detection of a synchronization error in code words if $2(T+S)<d$ where T is the number of errors in the codeword and $0 \leq T \leq \lfloor d/2 \rfloor$, and s is the number of symbols that the head is shifted. If, for example, the ECC is a distance 37 code that can correct 17 errors and the code word contains 10 errors, the system can detect with certainty a mis-synchronization error of up to 8 symbols. For large redundancy codes, the system can detect essentially all synchronization errors with certainty.

Using the system of FIG. 2, an optimal coset leader is included in the code word by strategically encoding a "coset symbol," $C_x$, which is a selected non-zero symbol of the applicable Galois Field. The coset symbol $C_x$ is supplied to an adder 13 in the last stage of the circuit 110 while the data symbols are being encoded or, alternatively, in the clock cycle immediately after the last data symbol has been encoded. The adder 13 combines the coset symbol with the contents of the register 21 in the last stage of the circuit 110 and, as appropriate, a data symbol or a first redundancy symbol on line 22. The sum produced by the adder 13 is then multiplied by $\alpha^{L+R-1}$ in the associated Galois Field multiplier 15, and the product is supplied to update the register 21. As appropriate, the product is also fed back to line 22 as a redundancy symbol.

When the update value that includes the coset symbol is thereafter supplied on line 22 to each stage, the coset symbol is also encoded also into the remaining redundancy symbols. The code word for recording is then produced from the k data symbols, and the R redundancy symbols that collectively include an associated coset leader. The code word thus contains a coset leader that is a code word of the distance d−1 code but not of the distance d code.

The adder 13 depicted in the drawing may be constructed as a series of XOR gates (not shown) that combine the coset symbol with the contents of the register 21, and then combine the resulting sum with the symbol on line 22. Alternatively, the adder 13 may be constructed as a series of XOR gates that combine the coset symbol with a sum of the register contents and the symbol on line 22.

With the inclusion of the coset symbol in the last stage of the circuit 110 in a clock cycle in which either a data symbol or the first redundancy symbol is encoded, the circuit produces a code word that is divisible by a polynomial which includes factors that correspond to the Galois Field multipliers in all but the last stage of the circuit. Accordingly, when the code word produced by the system 110 is decoded to produce error syndromes, the error syndrome $S_{L+R-1}$ produced by the last stage is non-zero, even if the code word is error-free. Thus, before the syndromes are used to determine error locations, the system must modify the syndrome $S_{L+R-1}$ produced by the last stage, to remove the contributions of the coset symbol. Accordingly, in a last step in the syndrome generation operations, with the switches 26 in position 3, the system 100 combines a predetermined syndrome value $S_x$ with the syndrome $S_{L+R-1}$ generated in the last stage. This produces a modified error syndrome $S^*_{L+R-1}$ that updates the associated register 21.

The modified error syndrome is then used in a conventional manner with the error syndromes generated in the other stages, to locate errors in the data or redundancy symbols. The system 100, however, first uses the syndromes, as modified, to determine if there is a synchronization error. Accordingly, the system determines if the syndromes correspond to an uncorrectable number of code word errors. If not, the system corrects the errors in a conventional manner, using the syndromes, as modified.

As depicted in the drawing, an adder 19 is used to combine the syndrome value $S_x$ with the generated syndrome $S_{L+R-1}$. The adder 19 may be constructed as a series of XOR gates.

The exemplary system includes the coset leader $C_x$ in the last stage of the circuit 110, so that only one generated error syndrome must be modified during decoding. The coset value may instead by included in a preceding stage, for example, stage R−1, and the error syndromes $S_{L+R-1}$ and $S_{L+R-2}$ will then require modification, and so forth.

The error correction system 100 includes the coset leader in the code word by modifying a necessary step in the encoding operations. Further, the system decodes the code word by modifying a necessary last step in the syndrome generating operations. The system thus provides mis-synchronization detection without requiring an additional clock cycle for an XOR operation after a data code word is produced and/or an additional clock cycle for an XOR operation prior to syndrome generation. The system also uses minimal storage, since it retains only the coset symbol and one or more associated syndrome values. Further, the mis-synchronization detection is optimized for the associated code to provide consistently better detection than systems that use trial and error methods to select a noise-like sequence or to select a coset leader that is a code word of a distance d'<d−1 supercode of the distance d Reed Solomon code.

The combined encoder/syndrome generation system described in co-pending application Ser. No. 09/187,144 entitled PIPELINED COMBINED SYSTEM FOR PRODUCING ERROR CORRECTION CODE SYMBOLS AND ERROR SYNDROMES FOR LARGE ECC REDUNDANCY which is assigned to a common assignee and incorporated herein by reference may be similarly modified in its last stage or stages, to include a coset symbol during encoding and a syndrome value during syndrome generation.

What is claimed is:

1. A method for producing a code word for use in detecting a synchronization error, the method including the steps of:

A. encoding k data symbols in accordance with a distance d Reed-Solomon code in an R stage encoder;

B. including a coset symbol in the $R^{th}$ stage of the encoder, to produce redundancy symbols that include a coset leader that corresponds to the coset symbol and is a code word of the distance d−1 code and not a code word of the distance d code; and C. producing a code word of a distance d−1 Reed-Solomon code that includes the k data symbols and the redundancy symbols.

2. The method of claim 1 wherein the step of including a coset symbol includes the coset symbol in a clock cycle in which one of the k data symbols is encoded.

3. The method of claim 1 wherein the step of including a coset symbol includes the coset symbol in a clock cycle in which the first redundancy symbol is encoded.

4. A method of detecting a synchronization error, the method including the steps of:

A. encoding k data symbols in accordance with a distance d Reed-Solomon code in an R stage encoder;

B. including a coset symbol in the $R^{th}$ stage of the encoder, to produce R redundancy symbols that include a coset leader that corresponds to the coset symbol and is a code word of the distance d−1 code and not a code word of the distance d code;

C. producing a code word of a distance d−1 Reed-Solomon code that includes the k data symbols and the R redundancy symbols;

D. decoding the code word in an R stage syndrome generator to produce R syndromes $S_L, S_{L+1}, S_{L+2} \ldots S_{L+R-2}, S_{L+R-1}$;

E. combining a predetermined syndrome value with the syndrome $S_{L+R-1}$ that is produced by the $R^{th}$ stage of the syndrome generator to produce a modified syndrome $S^*_{L+R-1}$;

F. detecting a synchronization error if the syndromes $S_L, S_{L+1}, S_{L+2} \ldots S_{L+R-2}$, and the modified syndrome $S^*_{L+R-1}$ correspond to an uncorrectable number of errors.

5. The method of claim 4 wherein the step of combining a predetermined syndrome value includes combining the value with the syndrome in a clock cycle is which the last code word symbol is supplied for decoding.

6. A system for detecting synchronization errors, the system including:

A. an R stage combined encoder/syndrome generator circuit for encoding symbols in accordance with a generator polynomial of a distance d Reed-Solomon code, B. one or more adders for
   i. including a coset symbol in an $I^{th}$ stage of the circuit during encoding operations, where I≦R, and
   ii. combining predetermined syndrome values with a syndrome produced by the I, I+1, I+2, . . . ,R stages of the circuit to produce modified syndromes; and C. a detector for detecting a synchronization error if the syndromes produced by the 1,2 . . . I−1 stages and the modified syndromes associated with stages I, I+1, I+2 . . . R correspond to an uncorrectable number of errors.

7. The system of claim 6 wherein the $I^{th}$ stage is the last stage of the R stage circuit.

8. The system of claim 6 wherein the one or more adders combine the coset symbol with a next data symbol and a value produced during the encoding of succeeding data symbols.

9. The system of claim 6 wherein the one or more adders combine the coset symbol with both a first redundancy symbol and a value produced by the encoding of the k data symbols.

10. The system of claim 7 wherein the one or more adders combine the syndrome value with the syndrome generated in the $R^{th}$ stage by the encoding of the code word symbols.

* * * * *